US008492697B2

(12) United States Patent
Neubauer et al.

(10) Patent No.: US 8,492,697 B2
(45) Date of Patent: Jul. 23, 2013

(54) HYBRID ANALOG-TO-DIGITAL CONVERTER, AN IMAGE SENSOR AND A METHOD FOR PROVIDING A PLURALITY OF DIGITAL SIGNALS

(75) Inventors: Harald Neubauer, Erlangen (DE); Johann Hauer, Erlangen (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 156 days.

(21) Appl. No.: 13/196,601

(22) Filed: Aug. 2, 2011

(65) Prior Publication Data

US 2012/0025062 A1  Feb. 2, 2012

(30) Foreign Application Priority Data

Aug. 2, 2010  (EP) ..................... 10171610

(51) Int. Cl.
*H03M 1/38* (2006.01)
*H03M 1/12* (2006.01)
*H01L 27/146* (2006.01)

(52) U.S. Cl.
USPC ............... 250/208.1; 250/214 DC; 341/110; 341/126; 341/155; 341/161

(58) Field of Classification Search
USPC ............. 250/208.1, 214 R, 214 DC, 214 SW; 341/110, 126, 144, 155, 158, 161; 327/124, 327/307
See application file for complete search history.

(56) References Cited

U.S. PATENT DOCUMENTS 4,618,847 A   10/1986  Iida et al.
5,119,097 A   6/1992   Ohkura et al.
5,270,716 A   12/1993  Guenter et al.
5,801,657 A   9/1998   Fowler et al.
6,707,403 B1  3/2004   Hurrell (Continued)

FOREIGN PATENT DOCUMENTS

EP   1858245    11/2007
JP   59-163912  9/1984

(Continued)

OTHER PUBLICATIONS

Centen, et al., "A ⅔ inch CMOS Image Sensor for HDTV Applications with Multiple High-DR Modes and Flexible Scanning", IEEE Solid-State Circuits Conference, ISSCC 2007 Digest of Technical Papers, Feb. 11-15, 2007, pp. 512-619.

(Continued)

*Primary Examiner* — Kevin Pyo
(74) *Attorney, Agent, or Firm* — Michael A. Glenn; Glenn Patent Group

(57) ABSTRACT

A hybrid analog-to-digital converter includes a plurality of converting circuits. Each converting circuit is configured to provide a digital signal based on an analog input signal by performing a successive approximation conversion to obtain, as a result of the successive approximation conversion, a first number of bits of the digital signal, and by subsequently performing a slope conversion based on a common variable reference voltage to obtain a second number of bits of the digital signal, the second number of bits corresponding to a residual between the analog input signal and the result of the successive approximation conversion. The hybrid analog-to-digital converter further includes a common variable reference voltage provider configured to provide to each converting circuit of the plurality of converting circuits the common variable reference voltage.

17 Claims, 10 Drawing Sheets

U.S. PATENT DOCUMENTS

| | | | |
|---|---|---|---|
| 7,821,441 B2 * | 10/2010 | Westwick et al. | 341/163 |
| 8,159,382 B2 * | 4/2012 | Srinivasa et al. | 341/156 |
| 2006/0001563 A1 | 1/2006 | Kearney | |
| 2007/0279506 A1 | 12/2007 | Sato et al. | |
| 2008/0211951 A1 | 9/2008 | Wakabayashi et al. | |
| 2008/0239106 A1 | 10/2008 | Sano et al. | |
| 2010/0156685 A1 | 6/2010 | Westwick et al. | |

FOREIGN PATENT DOCUMENTS

| | | |
|---|---|---|
| JP | H04505388 | 9/1992 |
| JP | 2007243324 | 9/2007 |
| JP | 2008219243 | 9/2008 |
| JP | 2008244716 | 10/2008 |
| JP | 2008294613 | 12/2008 |

OTHER PUBLICATIONS

Chae, et al., "A 2. Mpixel 120frame/s CMOS Image Sensor with Column-Parallel SD ADC Architecture", Solid-State Circuits Conference 2010, Feb. 10, 2010, 3 pages.

Cheng, et al., "iVisual: An Intelligent Visual Sensor SoC with 2790 fps CMOS Image Sensor and 205 GOPS/W Vision Processor", IEEE Journal of Solid-State Circuits, vol. 44, No. 1, Jan. 2009, pp. 127-135.

Fang, et al., "CMOS 12 bits 50kS/s Micropower SAR and Dual-Slope Hybrid ADC", IEEE, XP002615134, Aug. 2009, pp. 180-183.

Liu, C. , "10b 100MS/s 1.13mW SAR ADC with Binary-Scaled Error Compensation", Solid State Circuits Conference 2008 (ISSCC 2008), Feb. 2008, pp. 386-388.

Matsuo, et al., "8.9-Megapixel Video Image Sensor with 14-b Column-Parallel SA-ADC", Transactions on Electron Devices, vol. 56, Nov. 2009, pp. 2380-2389.

Posch, C. , "A QVGA 143dB Dynamic Range Asynchronous Address Event PWM Dynamic Image Sensor with Lossless Pixel-Level Video Compression", Solid-State Circuits Conference 2010, Feb. 10, 2010, 3 pages.

Sasaki, et al., "A Wide-Dynamic Range CMOS Image Sensor Based on Multiple Short Exposure-Time Readout with Multiple-Resolution Column-Parallel ADC", IEEE Sensors Journal, vol. 7, No. 1, Jan. 2007, pp. 151-158.

Snoeij, et al., "A CMOS Image Sensor with a Column-Level Multiple-Ramp Single-Slope ADC", IEEE, XP002615135, Feb. 15, 2007, pp. 506-507.

Snoeij, et al., "A CMOS Imager with Column-level ADC Using Dynamic Column FPN Reduction", IEEE Solid-State Circuits Conference, Digest of Technical Papers, Feb. 2006, pp. 2014-2023.

Xu, et al., "A new digital-pixel architecture for CMOS image sensor with pixel-level ADC and pulse width modulation using a 0.18 11m CMOS technology", IEEE Conference on Electron Devices and Solid-State Circuits, Dec. 2003, pp. 265-268.

Yang, et al., "An Integrated 800×600 CMOS Imaging System", IEEE ISSCC 99 / session 17/ paper WA 17.3; XP00261516, Jan. 1999, pp. 304-305, 471.

* cited by examiner

| ADC-type | Hardware | Time [comparator decisions] |
|---|---|---|
| 12 bit SAR | $2^{12}$ = 4096 capacitors<br>1 comparator<br>12 bit register | 12 |
| 12 bit slope | 1 comparator<br>12 bit register | $2^{12}$=4096 |
| 12 bit hybrid | $2^6$ = 64 capacitors<br>1 comparator<br>12 bit register | 6+64=70 |

FIGURE 3

HYBRID ANALOG-TO-DIGITAL CONVERTER, AN IMAGE SENSOR AND A METHOD FOR PROVIDING A PLURALITY OF DIGITAL SIGNALS

CROSS-REFERENCE TO RELATED APPLICATIONS

This application claims priority from European Patent Application No. 10171610.8, which was filed on Aug. 2, 2010, and is incorporated herein in its entirety by reference.

BACKGROUND OF THE INVENTION

Embodiments of the present invention provide a hybrid analog-to-digital converter, which may be employed in image sensors for digital still cameras or digital video cameras. Further embodiments of the present invention provide an image sensor, which may be employed in digital still cameras or digital video cameras. Further embodiments of the present invention provide a method for providing a plurality of digital signals based on a plurality of analog input signals.

Different approaches exist for the conversion of a plurality of analog-to-digital channels (for example, several thousands). Due to the high number of converters necessitated, the parameters power and area have significant borders, limiting a maximum number of converters, and therefore a maximum number of channels that can be converted simultaneously. Analog-to-digital converters (ADCs) for converting a high number of channels are especially used in image sensors.

In image sensors the power and area requirements for analog to digital converters set significant limitations for resolution and frame rate.

CMOS (Complementary-Metal-Oxide-Semiconductor) image sensors necessitate very power and area effective analog-to-digital converters due to very high column count and small column spacing. CMOS image sensors have substantially improved in recent years. The development is driven by digital still cameras and imagers in mobile devices. Integrating the analog-to-digital converter on the CMOS image sensor is a key feature when building a cost effective camera on chip. The pixel race is still ongoing, which leads to severe design demands for the ADC. In megapixel image sensors several thousand columns (e.g. 4000 and more) with a spacing of 1.5 µm to 10 µm result in tough constrains for the area and power of the ADC.

In conventional image sensors typically column-converters are used for the digitization. These are converters, which are arranged in a column pattern, wherein each converter converts analog signals from photo detectors in its column. A column pattern (or column spacing) of typical image sensors is in the range between 1.5 µm to 10 µm. The number of columns may, for example, be 4000. Due to the number of columns, the available power per converter is limited. As a result, a warming of the image sensor, which leads to an increase in the dark current of the photodiodes (or in general of the photo detectors) of the image sensor, which is not tolerated. Otherwise may the increase in dark current lead to a decrease in image quality. As it can be seen, a problem with image sensors is the parallel digitization of a high number of channels with a very limited area and power.

Recently ADCs on imagers have moved from imager level (where typically pipeline ADCs have been used) to column level (where often slope converters are used).

For more details on image level ADCs see Centen, P.; Lehr, S.; Neiss, V.; Roth, S.; Rotte, J.; Schemmann, H.; Schreiber, M.; Vogel, P.; Boon-Keng Teng; Damstra, K.; "A ⅔ inch CMOS Image Sensor for HDTV Applications with Multiple High-DR Modes and Flexible Scanning," Solid-State Circuits Conference, 2007. ISSCC 2007. Digest of Technical Papers. IEEE International, pp. 512-619, 11-15 Feb. 2007.

For more information on column level ADCs see also Woodward Yang; Oh-Bong Kwon; Ju-Il Lee; Gyu-Tae Hwang; SukJoong Lee; "An integrated 800×600 t-MOS imaging system," Solid State Circuits Conference, 1999. Digest of Technical Papers. ISSCC. 1999 JEEE International, vol., no., pp. 304-305, 1999 doi: 10.1 109/ISSCC.1999.759261.

FIG. 8 shows a block diagram of a column level analog-to-digital converter within an image sensor. In this architecture, the analog-to-digital converter is directly at the column of the pixel array of an image sensor. There is thus no need for horizontal multiplexing. The main drawback of this architecture is the limited space and power. Today's trends towards smaller pixels lead to column spacing of a few µm (down to 1.5 µm). Although column pitch can be usually doubled by dividing the ADC to top and bottom of the imager (as it is shown in FIG. 8), however, it is still very small for integrating an analog-to-digital converter for each column. Not many analog-to-digital converter architectures are easily integratable in this space.

A popular approach is a single slope implementation, but this architecture is not feasible for increasing pixel counts and ADC resolution as the time for the comparator is reduced by both (by the increasing pixel counts and the increasing ADC resolution). In conventional image sensors, these slope converters are used very frequently, but, as mentioned, this approach is not applicable for larger image sensors (comprising several megapixels) and with higher resolutions (equal to or above 12 bits), because of the necessitated time for the comparator decisions becoming too low.

Recently a multi-ramp approach has been reported (see also Snoeij, M. R.; Donegan, P.; Theuwissen, A. J. P.; Makinwa, K. A. A.; Huijsing, J. H.; "A CMOS Image Sensor with a Column-Level Multiple-Ramp Single-Slope ADC," Solid-Stare Circuits Conference, 2007. ISSCC 2007. Digest of Technical Papers. IEEE International pp. 506-618, 11-15 Feb. 2007).

According to Xiang fang, Srinvasan, V., Wills, J., Granacki, J., LaCoss, J., Choma J., "CMOS 12 bits 50 kS/s micropower SAR and dual-slope hybrid ADC," Circuits and Systems 2009. MWSCAS '09. $52^{nd}$ IEEE International Midwest Symposium on, vol., no., pp. 180-183, 2-5 Aug. 2009 doi: 10.1109/MWSCAS.2009.5236122, a combination of a successive approximation ADC (SAR-ADC) and dual slope ADC is shown. This converter has a successive approximation stage and a dual slope integrator stage. The converter shown in this document is not applicable for image sensors, due to the area it necessitates, because it would necessitate an implementation of the dual slope integrator and a successive approximation stage for every converter, and therefore, for every column of the image sensor.

SUMMARY

According to an embodiment, a hybrid analog-to-digital converter may have: a plurality of converting circuits, wherein each converting circuit of the plurality of converting circuits is configured to provide a digital signal based on an analog input signal by performing a successive approximation conversion to obtain, as a result of the successive approximation conversion, a first number of bits of the digital signal and by subsequently performing a slope conversion based on a common variable reference voltage to obtain a second number of bits of the digital signal, the second number of bits corresponding to a residual between the analog input signal and the result of the successive approximation conversion; and a common variable reference voltage provider configured to provide to each converting circuit of the plurality of converting circuits the common variable reference voltage.

According to another embodiment, an image sensor may have: a photo detector array having a plurality of photo detector rows and a plurality of photo detector columns; and an inventive hybrid analog-to-digital converter, the hybrid analog-to-digital converter having one converting circuit per photo detector column; wherein each converting circuit is configured to successively perform an analog-to-digital conversion for each photo detector lying in a photo detector column of the plurality of photo detector columns, associated to the conversion circuit.

According to another embodiment, a method for providing a plurality of digital signals, based on a plurality of analog input signals, may have the steps of simultaneously performing a plurality of successive approximation conversions to obtain, as results of the successive approximation conversions, a plurality of first numbers of bits of the plurality of digital signals; and simultaneously performing a plurality of slope conversions based on a common variable reference voltage to obtain a plurality of second numbers of bits of the plurality of digital signals, each of the second numbers of bits of the plurality of second numbers of bits corresponding to a difference between a corresponding analog input signal of the plurality of analog input signals and a corresponding result of a corresponding successive approximation conversion.

Embodiments of the present invention provide a hybrid analog-to-digital converter comprising a plurality of converting circuits. Each of the converting circuits is configured to provide a digital signal based on an analog input signal by performing a successive approximation conversion to obtain, as a result of the successive approximation conversion, a first number of bits of the digital signal and by subsequently performing a slope conversion based on a common variable reference voltage to obtain a second number of bits, the second number of bits corresponding to a residual between the analog input signal and the result of the successive approximation conversion. The hybrid analog-to-digital converter further comprises a common variable reference voltage provider configured to provide the common variable reference voltage to each converting circuit of the plurality of converting circuits.

It is a key idea of embodiments of the present invention that a better conversion rate to power and area ratio within an analog-to-digital converter can be achieved, if the analog-to-digital converter comprises a plurality of converting circuits, each configured to combine a successive approximation conversion with a slope conversion and if a variable reference voltage (for example, a global ramp or global slope) is provided by a common variable reference voltage provider to all of the converting circuits. By using a common variable reference voltage provider for all converting circuits, the area necessitated for the slope conversion in the converting circuit can be reduced, compared to concepts in which every converting circuit generates its own variable reference voltage for performing the slope conversion, for example, in the case of the described concept in the introductory part of this application, using the dual slope integrator.

It is an advantage of embodiments of the present invention that by combining advantages of successive approximation conversion (high conversion speed) and slope conversion (small area necessitated), and by using a common variable reference voltage provider to provide the common variable reference voltage used during slope conversion, a better conversion rate to power and area ratio can be achieved.

Embodiments of the present invention may be employed in image sensors, wherein per image sensor one hybrid analog-to-digital converter may be employed and each photo detector column of the image sensor may be associated to one converting circuit of the hybrid analog-to-digital converter, such that each converting circuit is configured to convert analog signals to digital signals from each photo detector in its photo detector column. All of the converting circuits may receive the common variable reference voltage on the basis of which the converting circuits perform their slope conversion from one common variable reference voltage provider (for example, a global ramp provider) of the hybrid analog to digital converter. In other words, embodiments of the present invention enable an image sensor comprising a plurality of converting circuits (for example, one converting circuit per column) and only one common variable reference voltage provider per image sensor. This is a significant advantage over the approach mentioned in the introductory part of this application, wherein, for each analog to digital converter, a complete dual slope integration stage would have to be implemented.

According to further embodiments of the present invention, a hybrid analog-to-digital converter may comprise exactly one common variable reference voltage provider to provide the common variable reference voltage to each converting circuit.

In embodiments of the invention, there may be a division of converters into a first converter bank and into a second converter bank. In such case, a first reference voltage may be provided for the first converter bank and a second reference voltage may be provided for the second converter bank.

BRIEF DESCRIPTION OF THE DRAWINGS

Embodiments of the present invention will be detailed subsequently referring to the appended drawings, in which:

FIG. 2b shows a block diagram of a hybrid analog-to-digital converter according to a further embodiment of the present invention with a plurality of converting circuits according to FIG. 2a;

FIG. 3 shows a table showing a comparison of hardware for different 12-bit analog-to-digital converters;

FIG. 4b shows a block diagram of a hybrid analog-to-digital converter according to a further embodiment of the present invention comprising a plurality of converting circuits according to FIG. 4a;

DETAILED DESCRIPTION OF THE INVENTION

Before embodiments of the present invention are explained in greater detail in the following taking reference to the figures, it is to be pointed out that the same or functionally equal elements are provided with the same reference numbers, and that a repeated description of these elements will be omitted. Hence, the description of the elements provided with the same reference numbers is mutually interchangeable and/or applicable in the various embodiments.

Figure 1:
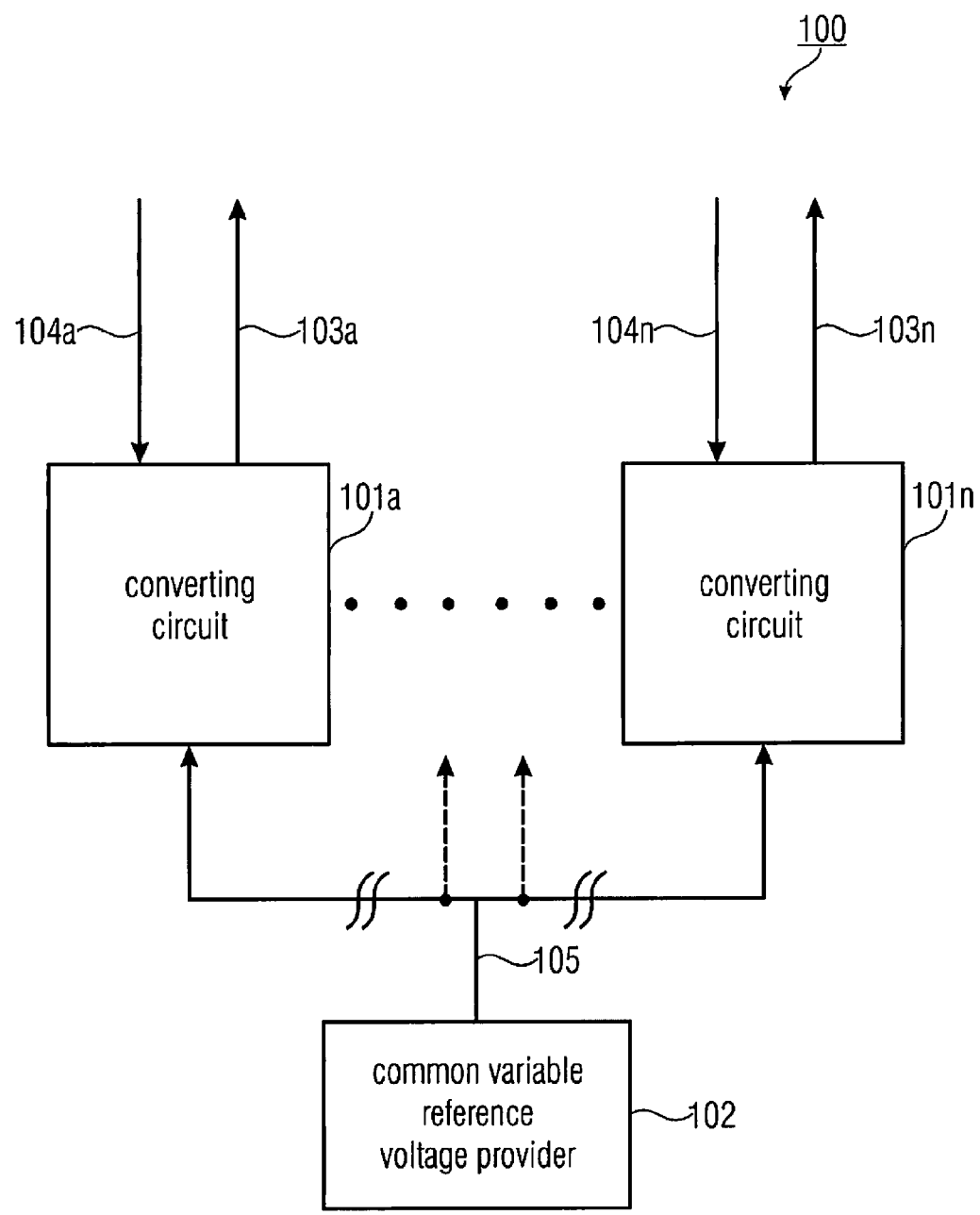
FIG. 1 shows a block diagram of a hybrid analog-to-digital converter according to an embodiment of the present invention.

FIG. 1 shows a block diagram of a hybrid analog-to-digital converter 100. The hybrid analog-to-digital converter 100 comprises a plurality of converting circuits 101a to 101n and a common variable reference voltage provider 102. Each of the converting circuits 101a to 101n is configured to provide a digital signal 103a to 103n based on an analog input signal 104a to 104n by performing a successive approximation conversion to obtain, as a result of the successive approximation conversion, a first number of bits of the digital signal 103a to 103n and by subsequently performing a slope conversion based on a common variable reference voltage 105 to obtain a second number of bits of the digital signal 103a to 103n, the second number of bits corresponding to a residual between the analog input signal 104a to 104n and the result of the successive approximation conversion. The common variable reference voltage provider 102 is configured to provide the common variable reference voltage 105 to each converting circuit 101a to 101n.

The converting circuits 101a to 101n may perform the successive approximation conversion using a charge redistribution successive approximation conversion, for example, by using a switched capacitor approach. Furthermore, the converting circuits 101a to 101n may perform the slope conversion using a single slope approach.

The function of the converting circuit 101a to 101n will be explained in the following using a converting circuit 101a as an example, but this explanation may also apply for the remaining converting circuits of the hybrid analog-to-digital converter 100.

The converting circuit 101a may firstly perform the successive approximation conversion with an analog input signal 104a to obtain a first number of bits of a digital signal 103a. The first number of bits may, for example, be most significant bits of the digital signal 103a. In other words, the converting circuit 101a may firstly perform a coarse analog-to-digital conversion using the successive approximation conversion. After performing the successive approximation conversion, the converting circuit 101a may perform the slope conversion for converting the residual between the analog input signal 104a and the result of the successive approximation conversion (the first number of bits of the digital signal 103a) to obtain a second number of bits of the digital signal 103a. The second number of bits may, for example, be least significant bits of the digital signal 103a. The slope conversion may therefore be a fine analog-to-digital conversion to obtain the least significant bits of the digital signal 103a. In a concrete embodiment of the present invention, the converting circuit 101a may have a resolution of 12 bit, or in other words, the digital signal 103a may comprise 12 bits. The successive approximation conversion of the converting circuit 101a may have a precision of 6 bits, such that the result of the successive approximation conversion comprises 6 most significant bits (6 MSB), i.e. the above mentioned first number of bits comprises 6 bits. The slope conversion performed by the converting circuit 101a may also have a precision of 6 bits, such that the result of the slope conversion comprises 6 least significant bits (6 LSB), i.e. the above mentioned second number of bits comprises 6 bits. The digital signal 103a, which is the result of the successive approximation conversion and of the slope conversion, therefore is represented by the 6 most significant bits from the successive approximation conversion and by the 6 least significant bits from the slope conversion.

In embodiments of the invention, there may be a different number of least significant bits and a different number of most significant bits, wherein the numbers of least significant bits and most significant bits may be different.

As explained before, provides the common variable reference voltage provider 102, the common variable reference voltage 105 to each converting circuit 101a to 101n, and each converting circuit 101a to 101n performs its slope conversion based on the common variable reference voltage 105. The converting circuits 101a to 101n may therefore be equal to each other and perform their analog-to-digital conversion simultaneously. In other words, all converting circuits 101a to 101n (or a chosen set out of the converting circuits 101a to 101n) may firstly perform their successive approximation conversions and afterwards simultaneously perform their slope conversions based on the common variable reference voltage 105. Therefore, the common variable reference voltage 105 only needs to be provided to the converting circuits 101a to 101n during the slope conversion. During the successive approximation conversion, the common variable reference voltage 105 doesn't need to be provided to the converting circuits 101a to 101n, and may be grounded, or in other words, may have ground potential. Due to the use of the successive approximation conversion in the converting circuits 101a to 101n, every converting circuit 101a to 101n may need the same time to perform the successive approximation conversion (if the converting circuits 101a to 101n are equal). Therefore all converting circuits 101a to 101n performing a successive approximation conversion may simultaneously start and finish the successive approximation conversion. Hence, the common variable reference voltage 105, used for the slope conversion, can simultaneously be provided to each converting circuit 101a to 101n.

In contrast to the successive approximation conversion, the converting circuit 101a to 101n may need a different time, depending on the analog input signals 104a to 104n, to perform the slope conversion and may therefore not finish the slope conversion at the same time. The common variable reference voltage 105 may therefore be provided at least as long as every converting circuit 101a to 101n needs to convert its analog input signal 104a to 104n. According to further embodiments of the present invention, the common variable reference voltage provider 102 may be configured to ramp the common variable reference voltage 105 from a given first voltage level (for example, zero voltage) to a given second voltage level (for example, a supply voltage level), independently from the converting circuits 101a to 101n, but after the converting circuits 101a to 101n have performed their successive approximation conversions.

The common variable reference voltage provider 102 may therefore provide the common variable reference voltage 105 based on a successive approximation conversion ready signal until the common variable reference voltage 105 reaches the given second voltage level, independent of the state of the slope conversion of the converting circuits 101a to 101n.

The common variable reference voltage provider 102 may comprise a digital-to-analog converter for generating the common variable reference voltage 105, the digital-to-analog converter may, for example, comprise a resistive ladder, an R-2R network, or any other analog-to-digital converter principle. The common variable voltage provider 102 may thus be configured to vary the amplitude of the common variable reference voltage 105 in discrete steps. The common variable reference voltage provider 102 may therefore be configured to provide the common variable reference voltage 105 as a plurality of step-wise increasing discrete voltage levels, wherein each digital input code of the analog-to-digital converter corresponds to one discrete voltage level of the common variable reference voltage 105.

Furthermore, the common variable reference voltage provider 105 may provide a common variable counter signal in dependence on an amplitude of the common variable reference voltage 105 to each of the converting circuits 101a to 101n. The common variable counter signal may, for example, be the digital code used as an input for the digital-to-analog converter of the common variable voltage provider 102.

According to further embodiments, each converting circuit 101a to 101n may be configured to save a counter value of the common variable counter signal during each slope conversion. The saved counter value may correspond to an amplitude of the common variable reference voltage 105, at which a difference between its digital signal 103a to 103n and its analog input signal 104a to 104n is minimal, to derive the second number of bits of its digital signal 103a to 103n, based on the saved counter value. The saved counter value may also be the result of the slope conversion and therefore be the second number of bits. Of course, each converting circuit 101a to 101n may save a different counter value, depending on its analog input signal 104a to 104n.

According to further embodiments of the present invention, the common variable reference voltage provider 102 may not provide a common variable counter signal, but each converting circuit 101a to 101n may comprise a counter, which counts as long as the slope conversion is active, until the difference between its digital signal 103a to 103n and its analog signal 104a to 104n is minimized. If this difference is minimized, the counter stops and the counter value can be used as the second number of bits of its digital signal 103a to 103n.

According to further embodiments of the present invention, a resolution of the hybrid analog-to-digital converter 100 may be variable. This may, for example, be implemented by the common variable reference voltage provider 102 being configured to vary a step size and/or a number of discrete voltage levels of the common variable reference voltage 105, for example, based on a precision-adjust signal. As an example, for a resolution of 6 bits during the slope conversion $2^6$ different discrete voltage levels have to be provided by the common variable reference voltage provider 102 within the common variable reference voltage 105 during one slope conversion process. By reducing the resolution of the slope conversion by one bit, only $2^5$ discrete voltage levels have to be provided, which is half the number of discrete voltage levels provided for the 6 bit case. A necessitated time for performing the slope conversion may therefore be halved. This adaptive resolution can easily be achieved by omitting every second voltage level of the common variable reference voltage 105 by the common variable reference voltage provider 102. To still have the same range of the common variable reference voltage 105, the step size between two subsequently following discrete voltage levels may be increased (e.g., doubled for each one bit reduction in resolution).

The common variable reference voltage 105 may be provided by the common variable reference voltage provider 102 as a number of increasing discrete voltage steps, wherein a step size between two different discrete voltage steps, or a difference between two different discrete voltage steps, may be equal for all of the discrete voltage steps. The common variable reference voltage provider 102 may, therefore, be configured to provide a linear slope or ramp. According to further embodiments of the present invention, the common variable reference voltage provider 102 may also be configured to provide the common variable reference voltage 105 as a non-linear slope, for example, with different step sizes between different discrete voltage steps. This may be advantageous to compensate for any non-linearity of the hybrid analog-to-digital converter 100.

Embodiments of the present invention therefore provide a hybrid analog-to-digital converter with an adjustable resolution and, therefore, an adjustable conversion time. This is possibly due to the single slope approach used in embodiments of the present invention. Especially, when compared to the dual slope approach, mentioned in the introductory part of this application, in which a reduction in resolution is not as easy as with embodiment of the present invention.

Figure 2A:
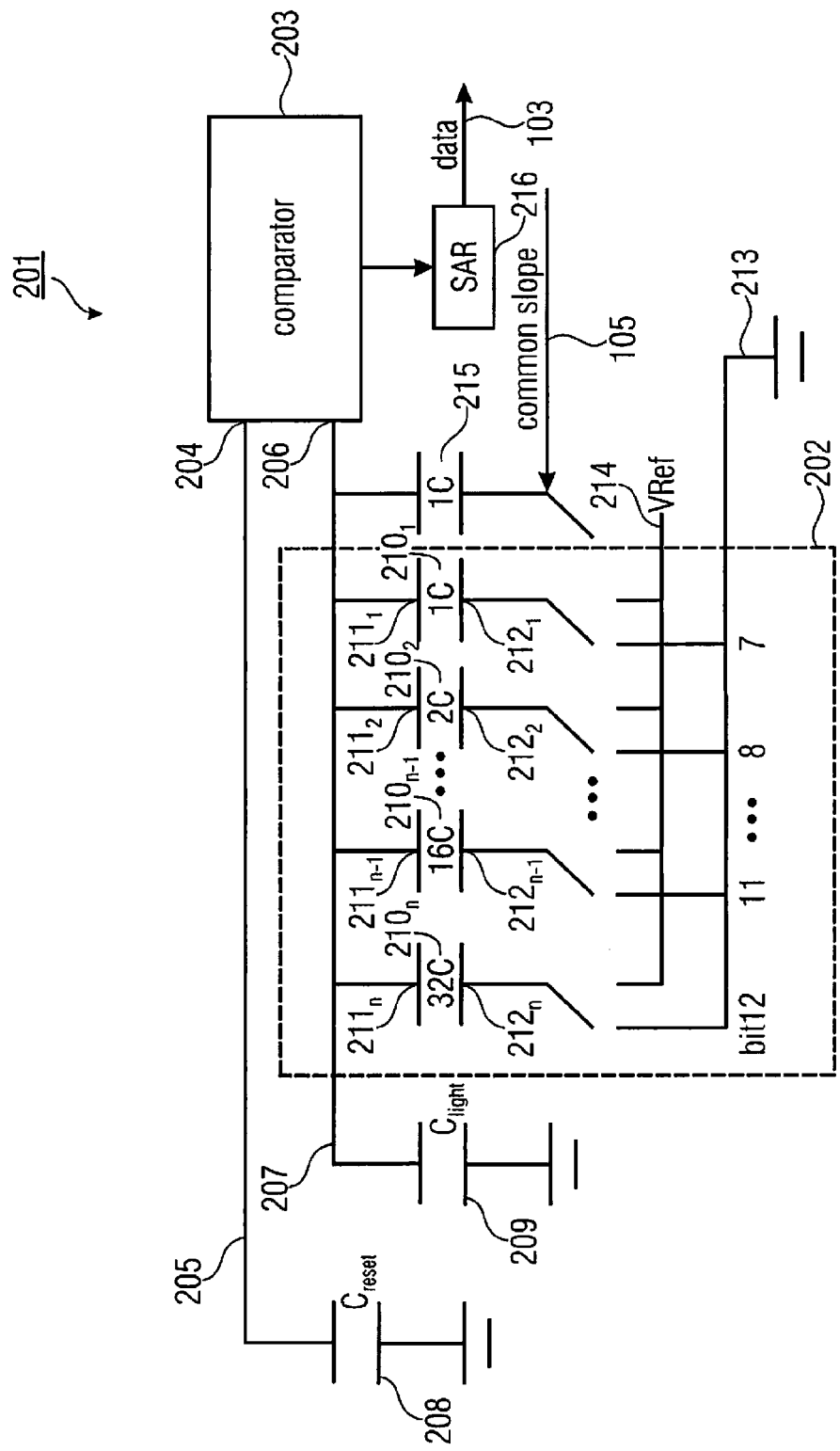
FIG. 2a shows a block diagram of a converting circuit, which may be employed in a hybrid analog-to-digital converter according to an embodiment of the present invention.

FIG. 2a shows a block diagram of a converting circuit 201, the converting circuit 201 may, for instance, be equal to one, some, or all of the converting circuits 101a to 101n of the hybrid analog-to-digital converter 100.

The converting circuit 201 comprises a switch capacitor array 202 and a comparator 203. A first input terminal 204 of the comparator 203 is coupled to a target voltage node 205, and a second input terminal of the comparator 206 is coupled to an intermediate voltage node 207, to which the switch capacitor array 202 is also coupled. The intermediate voltage node 207 is further configured to be coupled to an output terminal of a common variable reference voltage provider (for example, the common variable reference voltage provider 102 from FIG. 1), at which the common variable reference voltage 105 is provided. The converting circuit 201 is configured to firstly perform the abovementioned successive approximation conversion by using the switch capacitor array 202 in conjunction with the comparator 203. During the successive approximation conversion the switch capacitor array 202 performs a charge redistribution process transferring a first amount of charge from a reference voltage Vref to the intermediate node 207. After performing the successive approximation conversion, the converting circuit 201 is configured to add a second amount of charge to the intermediate node 207 by performing the abovementioned slope conversion, using the common variable reference voltage 105 as a global slope.

The converting circuit 201 may further comprise a target capacitor 208 coupled to the target node 205 and an intermediate capacitor 209 coupled to the intermediate node 207. The converting circuit 201 may, therefore, be configured to charge the target capacitor 208 to a target voltage and the intermediate capacitor 209 to an intermediate voltage before each analog-to-digital conversion cycle. An amplitude of the intermediate voltage and an amplitude of the target voltage may depend on the current analog-to-digital conversion cycle.

As an example, the converting circuit 201 may be coupled to a so-called pinned photodiode, these photodiodes have an improved sensitivity and a lower dark current. With these photodiodes, noise can be much lower through a correlated double sampling. The converting circuit 201 may perform this correlated double sampling by first reading out the reset value of the pinned photodiode, followed by the readout containing the information regarding the light. To gain information about the amount of light currently available at the photodiode, these two values can be subtracted (either analog or digital). With the shown converting circuit 201, this subtraction operation can be implemented in a very elegant manner. The reset signal of the pinned photodiode is stored on the target capacitor 208 (as the target voltage) and fed to the first input terminal 204 of the comparator 203 as a reference signal for the current analog-to-digital conversion cycle. The information regarding the light is stored as the intermediate voltage on the intermediate capacitor 209. The charge redistribution process (during the successive approximation conversion and the slope conversion) then merely adds the amount of charge (a first amount of charge added by the successive approximation conversion and a second amount of charge added by the slope conversion), which was removed from the pinned photodiode by the light, to the intermediate node 207 and therefore to the second input terminal 206 of the comparator 203. With the successive approximation conversion and the subsequent following slope conversion, a charge redistribution is done such that both voltages (the intermediate voltage and the target voltage) are nearly equal (depending on the resolution of the converting circuit 201). A digital signal 103 of the converting circuit 201 may therefore be a digital representation of the difference between the light and the reset value of a voltage of the pinned photodiode.

Embodiments of the present invention therefore provide for a converting circuit 201, in which a sampled voltage for a dark level of a pixel or a photo detector is used as a reference voltage for the analog-to-digital conversion of a current light level at the photo detector.

The digital signal 103 being a digital representation of an analog input signal of the converting circuit 201 therefore corresponds to a difference between the intermediate voltage and the target voltage before the successive approximation conversion. The analog input signal of the converting circuit 201 thus also corresponds with the difference between the intermediate voltage and the light voltage, or in other words, the converting circuit 201 converts a difference between two voltages into a digital signal. If the shown converting circuit 201 is used within an image sensor for converting analog input signals for a whole column of photo detectors, the reference voltage at the first input terminal 204 of the comparator 203 (the target voltage) may be different for each photo detector within the column and therefore for each analog-to-digital conversion cycle. By using different target voltages for different photo detectors, embodiments of the present invention can achieve a noise reduction compared to concepts in which for every analog-to-digital conversion, the same reference voltage is used. The noise, which can be reduced by the shown concept, may for example be caused by different dark level currents of different photo detectors as a result of device tolerances of the photo detectors.

As shown in FIG. 2a, the switch capacitor array 202 comprises a plurality of switch capacitors 210₁ to 210ₙ. In the example shown in FIG. 2a, n=6. This means that the switch capacitor array 202 comprises six switch capacitors 210₁ to 210ₙ, but this number of switched capacitors 210₁ to 210ₙ may, according to further embodiments, be arbitrary, depending on the desired successive approximation conversion resolution. The number of switch capacitors 210₁ to 210ₙ determines the resolution of the successive approximation conversion. In the example shown in FIG. 2a, the resolution of the successive approximation conversion is 6 bits. First terminals 211₁ to 211ₙ of the switch capacitors 210₁ to 210ₙ are coupled to the intermediate node 207 and therefore to the second input terminal 206 of the comparator 203. Second terminals 212₁ to 212ₙ of the switch capacitors 210₁ to 210ₙ are switchably coupled (through switches) to a ground terminal 213 of the converting circuit 201 or a fixed reference voltage terminal 214 of the converting circuit 201. The converting circuit 201 is configured to switchably couple the second terminals 212₁ to 212ₙ of the switch capacitors 210₁ to 210ₙ to the ground terminal 213 or the fixed reference voltage terminal 214 during the successive approximation conversion. The converting circuit 201 may, therefore, perform a charge redistribution successive approximation conversion using the switch capacitors 210₁ to 210ₙ. Capacitances of the switch capacitors 210₁ to 210ₙ may be binary scaled, which means every capacitance of the switch capacitors 210₁ to 210ₙ is a multiple of a capacitance of a smallest capacitor 210₁ with a factor of $2^n$. In the example shown in FIG. 2, the smallest capacitor 210₁ has a capacitance of 1C and a largest capacitor 210ₙ has a capacitance of 32 C. By binary scaling the capacitances of the switch capacitors 210₁ to 210ₙ different amounts of charge, based on a fixed reference voltage at the fixed reference voltage terminal 214 can be added to the intermediate node 207 by coupling different switch capacitors 210₁ to 210ₙ to the fixed reference voltage node 214. By using binary scaled capacitances, the switch capacitors 210₁ to 210ₙ may be implemented using unity capacitors, each having a capacitance of 1 C. I.e. the smallest capacitor 210₁ comprises one unity capacitor and the largest capacitor 210ₙ comprises 32 unity capacitors. The switch capacitor array 202 may thus comprise 63 unity capacitors.

For a correct implementation of a successive approximation switch capacitor array, one dummy capacitor comprising a capacitance of 1C may be needed, such that the switch capacitor array 202 comprises 64 unity capacitors. This one dummy capacitor is realized in the converting circuit 201 by a coupling capacitor 215 being configured to couple the common variable reference voltage 105 to the intermediate node 207. The coupling capacitor 215 thus has two different functions in that during the successive approximation conversion it works as a dummy capacitor (the common variable reference voltage 105 may have ground potential during the successive approximation conversion) and during the slope conversion the dummy capacitor 215 is used to couple the common variable reference voltage 105 to the intermediate node 207.

As the common variable voltage 105 is coupled to the intermediate node 207 via the coupling capacitor 215 comprising the capacitance 1 C, the common variable reference voltage 105 is divided by a factor of $2^{number\ of\ switch\ capacitors}$ of the digital signal 103.

The converting circuit 201 therefore combines the advantage of two ADC architectures, the most significant bits (the first number of bits, bit 12 to bit 7) are converted by the successive approximation conversion using the switch capacitor array 202 in very short time. Afterwards, a common slope (the common variable reference voltage 105 is applied to the intermediate node 207 via the coupling capacitor 215) to digitize the remaining least significant bits (bit 6 to bit 1). For this approach, 64 unity capacitors may be needed in one converting circuit 201 or in one column of an image sensor. Furthermore, the common variable reference voltage 105 may be generated as a 6 bit global ramp or global slope (e.g. comprising $2^6$ different discrete voltage levels) generated by the common variable reference voltage provider 102. The common variable reference voltage provider 102 may generate the common variable reference voltage 105 on an image level or an image sensor level, this means it may generate the common variable reference voltage 105 simultaneously for all converting circuits 201 of an image sensor.

In detail does the converting circuit 201 work as the following. Firstly, the target capacitor 208 is charged to its target voltage and the intermediate capacitor 209 is charged to its intermediate voltage. The converting circuit 201 then starts a successive approximation conversion by coupling a second terminal 212ₙ of the largest capacitor 210ₙ to the fixed reference voltage node 214. The comparator 203 then checks if the intermediate voltage is above the target voltage. If this is the case, the converting circuit 201 couples the second terminal 212ₙ of the largest capacitor 210ₙ to the ground terminal 213, and a "0" is stored in a successive approximation register 216 of the converting circuit 201 as the highest bit of the digital signal 103. Otherwise, if the intermediate voltage is still smaller than the target voltage, the second terminal $212_n$ of the largest capacitor $210_n$ stays coupled to the fixed reference voltage terminal 214 and a "1" is stored in the successive approximation register 216 of the converting circuit 201 as the highest bit of the digital signal 103. This step will be repeated for each switch capacitor $210_{n-1}$ to $210_1$. At the end of the successive approximation conversion, the intermediate voltage should be still smaller than the target voltage. The first numbers of bits of the digital signal 103 are stored in the successive approximation register 216. Afterwards, the converting circuit 201 performs the slope conversion to digitize the remaining difference between the target voltage and the intermediate voltage. Thus, the variable common reference voltage 105 is applied (as a common slope) via the coupling capacitor 215 to the intermediate node 207. An increase of the common variable reference voltage 105 therefore also leads to an increase of the intermediate voltage at the intermediate node 207. If the intermediate voltage becomes equal to the target voltage, the comparator 203 outputs a "1", meaning that the charge applied via the coupling capacitor 215 equals the difference between the target voltage and the intermediate voltage after the successive approximation conversion. The successive approximation register 216 may now store an internal counter value, corresponding to an amplitude of the common variable fixed reference voltage 105, as the second number of bits of the digital signal 103. As mentioned before, the common variable reference voltage provider 102 may also be configured to provide a common variable counter signal corresponding to the amplitude of the common variable reference voltage 105. The successive approximation register 216 may receive this common variable counter signal and store, triggered by the "1" of the comparator 203 during the slope conversion, a current counter value corresponding to the current amplitude of the common variable reference voltage 105. The stored counter value may therefore represent the difference between the intermediate voltage and the target voltage after the successive approximation conversion and be the second number of bits of the digital signal 103. After storing the first number of bits and the second number of bits, the bits may be combined to obtain the digital signal 103 as an output signal of the successive approximation register 216, and an output signal of the complete converting circuit 201. The analog-to-digital conversion cycle is thus completed, and a new analog-to-digital conversion cycle is able to start.

Figure 2B:
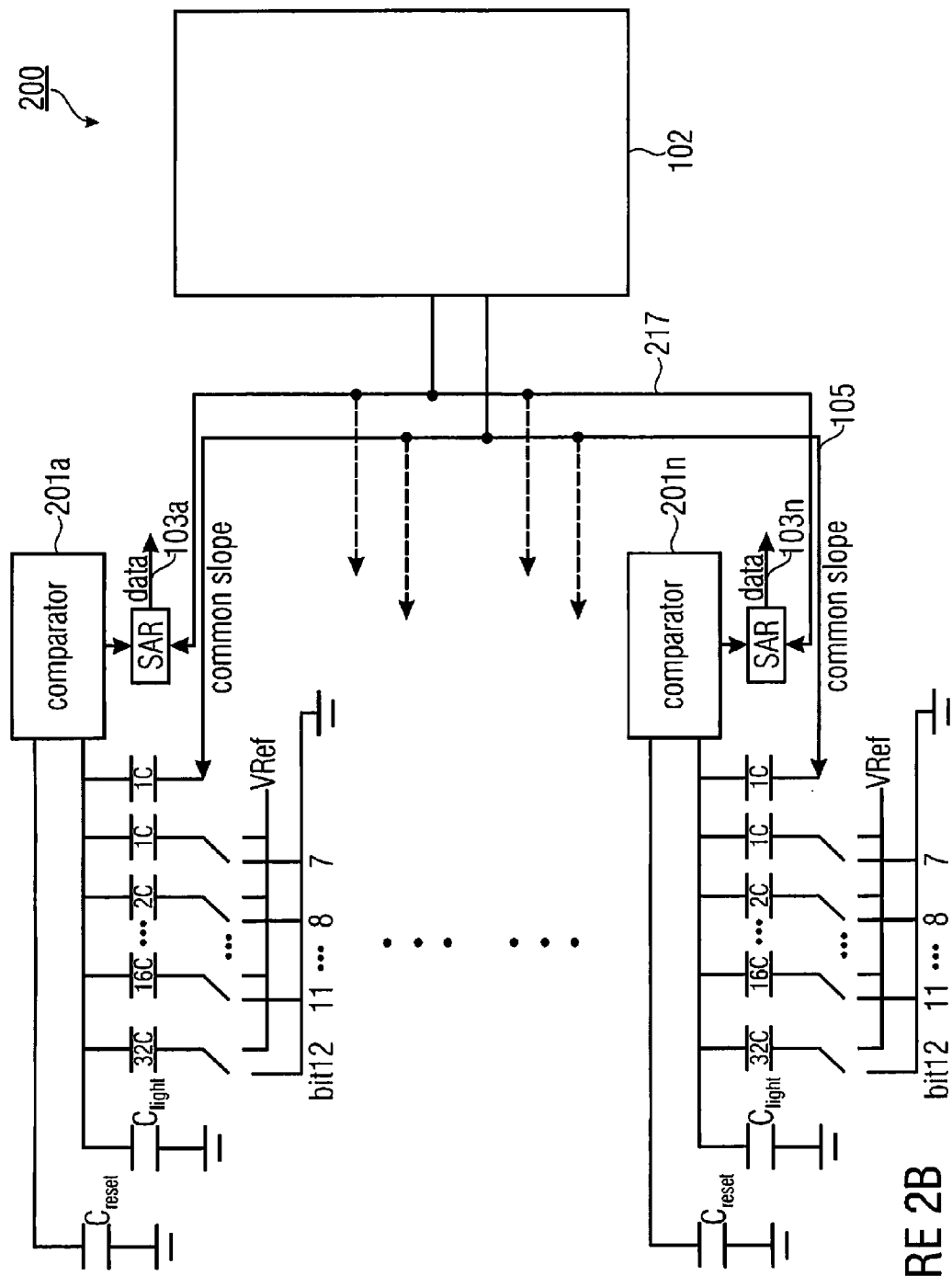

FIG. 2b shows a block diagram of a hybrid analog-to-digital converter 200 according to a further embodiment of the present invention. The hybrid analog-to-digital converter 200 may, for example, be a more detailed version of the hybrid analog-to-digital converter 100 from FIG. 1. The hybrid analog-to-digital converter 200 comprises a common variable reference voltage provider 102. Furthermore, the hybrid analog-to-digital converter 200 comprises a plurality of converting circuits 201a to 201n. Each of the converting circuits 201a to 201n may be equal to the converting circuit 201 from FIG. 2a. The common variable reference voltage provider 102 is configured to provide a common variable reference voltage 105 to each of the converting circuits 201a to 201n. As mentioned before, the common variable reference voltage provider 102 may further be configured to provide a common variable counter signal 217 to each of the converting circuits 201a to 201n during the slope conversion. The hybrid analog-to-digital converter 200 shown in FIG. 2b may be implemented in an image sensor, wherein each converting circuit 201a to 201n may be arranged next to one column of the image sensor, for providing an analog-to-digital conversion for each photo detector in its column. As mentioned before, the image sensor may only need one common variable reference voltage provider 102. Thus, due to the fact that each converting circuit 201a to 201n is a combination of a (6-bit) charge redistribution successive approximation analog-to-digital converter for the first number of bits (for the MSB) with a (6-bit) slope analog-to-digital converter for the second number of bits (for the LSB) a size or an area consumed by each converting circuit 201a to 210n can be kept small. As previously mentioned, the advantages of the two analog-to-digital architectures, are combined in this approach. The MSB are converted by the successive approximation conversion in a very short time. Thereafter, the common slope (the common variable reference voltage 105) is applied to all columns of the image sensor, and thus to each converting circuit 201a to 201n via coupling capacitors 215 to digitize the remaining LSB. The 12-bit hybrid SAR slope analog-to-digital converter 200 (as a detailed example) shown in FIG. 2b comprises 64 capacitors in one column, and hence, in each converting circuit 201a to 201n (plus the optional target capacitors and the optional intermediate capacitors). Further, a 6-bit global ramp (the common variable reference voltage 105) is generated by the common variable reference voltage provider 102, which for example, may comprise a digital-to-analog converter. For the approach, only one common variable reference voltage provider 102 may be needed, and thus, only one common variable reference voltage provider per image sensor may be sufficient. The global ramp can be generated by a resistive ladder, an R-2R network, or any other digital-to-analog converter. As a result of its low linearity requirement, this common variable voltage provider 102 and the digital-to-analog converter which it may comprise, may be built very small and power efficient.

According to further embodiments, to drive the common variable reference voltage 105 to all coupling capacitors 215 of the converting circuit 201a to 201n, a driving circuit may be necessitated in between the common variable reference voltage provider 102 and each converting circuit 201a to 201n. Such a driving circuit may be realized with one or more simple source follower and/or one or more operational amplifiers.

FIG. 3 shows a table showing a comparison of column hardware for a 12-bit analog-to-digital converter. Charge redistribution successive approximation analog-to-digital converters usually have very good figure of merit (FOM) values (also see C-C. Liu "10 b 100 MS/s 1.13 mW SAR ADC with Binary-Scaled Error Compensation" Solid-State Circuits Conference, 2008. ISSCC 2008). This shows their power efficiency in respect to speed. Unfortunately, they are not very small since in a standard implementation, the necessitated analog-to-digital converter is built as a binary scaled capacitor array. The size of this analog-to-digital converter doubles with every bit (N=resolution in bits):

$$Area \sim 2^N.$$

Therefore this implementation is not suitable for a column level ADC, such as it is typically employed in image sensors.

Slope converters have very low area consumption due to the fact that they can be built from a small comparator and digital counter, but their conversion time doubles with every bit (N=resolution in bits):

$$Time \sim 2^N.$$

As mentioned before, FIG. 3 shows in the table comparisons of different ADC-architectures, wherein a first column shows different ADC-types, a second column shows the hardware needed for the corresponding ADC-type and a third column shows the time needed for one conversion cycle using the corresponding ADC-type. The time is expressed in comparator decisions. As can be seen from the table of FIG. 3, the column hardware for the hybrid approach in this application introduced is much lower (64 capacitors for a 12-bit analog-to-digital converter) compared to a 12-bit successive approximation analog-to-digital converter (4096 capacitors), and on the other hand, the needed number of comparator decisions is only 70, which is much lower than the 4096 needed for the slope analog-to-digital converter, and only a little more than for the successive approximation analog-to-digital converter. Embodiments of the present invention therefore provide a better compromise between conversion time and hardware needed for analog-to-digital converters, especially for analog-to-digital converters within image sensors, wherein typically one converting circuit or converting stage per column of the image sensor is needed.

In other words, with the hybrid approach, both above mentioned methods can be combined. As an example for converting 12-bits, the binary successive approximation converter needs $2^{12}=4096$ capacitances and 12 clock cycles (comparator decisions). The slope converter 4096 needs for the same conversion clock cycles. In the hybrid approach (such as it is employed in embodiments of the present invention), in which as an example 6-bits are converted using a successive approximation converter and 6-bits are converted using a slope converter $2^6=64$ capacitances and 6 (successive approximation converter)+64 (slope)=70 clock cycles are sufficient.

Embodiments of the present invention thus combine the fast charge redistribution successive approximation analog-to-digital converter with the small area requirements of slope analog-to-digital converters.

A resolution of the successive approximation conversion and therefore the number of capacitors needed and a resolution of the common variable reference voltage 105, and thus, the number of discrete voltage levels (corresponding to the conversion time of the slope conversion) may be arbitrarily chosen, depending on the needed hardware and conversion time requirements.

Some embodiments of the present invention use one charge redistribution successive approximation analog-to-digital converter per column. This may necessitate one clock per bit in a binary style and $2^N$ (N=resolution in bits) capacitances. This means that the number of capacitances (which correspond to the necessitated area) increases with the resolution by a factor of $2^N$. For the least significant bits, a common digital-to-analog converter (for example a common slope converter) is used. For the common digital-to-analog converter, the number of necessitated clocks is $2^N$. This means that with an increase in resolution, the number of clocks and therefore the time increases with a factor of $2^N$.

With the hybrid approach used in embodiments of the present invention, both mentioned concepts are combined. As seen from FIG. 3, a significant saving in area compared to the binary scaled successive approximation analog-to-digital converter can be achieved and a significant reduction in conversion time compared to a slope converter can be achieved.

A linearity of the hybrid analog-to-digital converter 200 shown in FIG. 2b may depend on the matching of the binary scaled switch capacitors $210_1$ to $210_n$. Due to the small area available in image sensors for the converting circuits 201a to 201n (as a result of the column spacing), the capacitor size, and therefore the size of the mentioned unity capacitor is very limited. This may lead to relatively high mismatch between the capacitances of the different switch capacitors $210_1$ to $210_n$, which can lead to missing codes at major code transitions. Such missing codes are highly undesired, especially in image sensors, in which the hybrid analog-to-digital converter 200 may be employed, since they are easily viewable in an acquired picture.

Figure 4A:
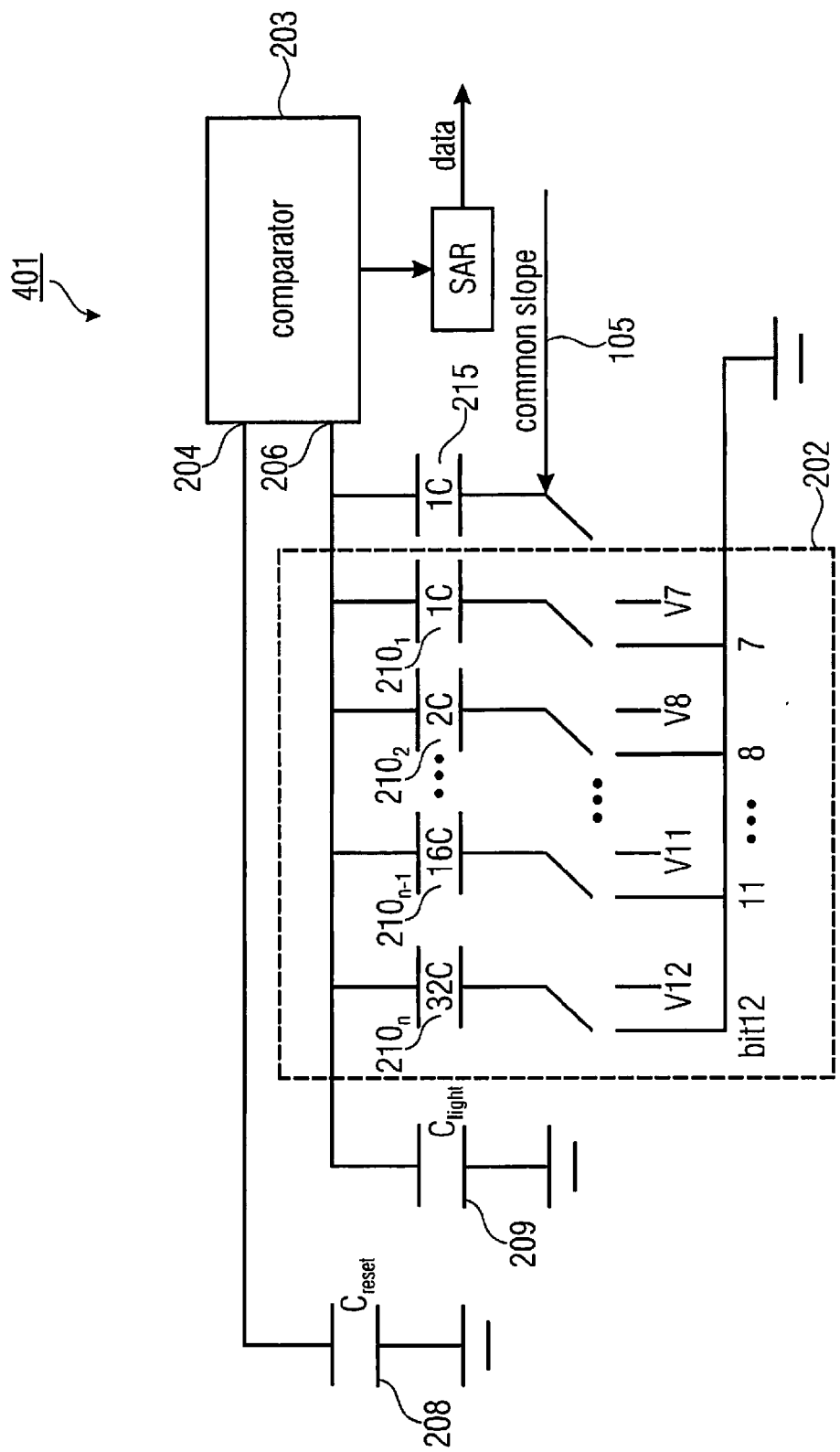
FIG. 4a shows a block diagram of another converting circuit which may be employed in an analog-to-digital converter according to an embodiment of the present invention.

An enhanced version of the converting circuit 201 from FIG. 2a is therefore shown in FIG. 4a to circumvent the above mentioned problem.

FIG. 4a shows a block diagram of a converting circuit 401 as it may be employed in a hybrid analog-to-digital converter according to an embodiment of the present invention. The converting circuit 101a to 101n shown in FIG. 1 may, for example, be equal to the converting circuit 401 shown in FIG. 4a. The converting circuit 401 differs from the converting circuit 201 by the fact that each switch capacitor $210_1$ to $210_n$ of the converting circuit 401 can be coupled to a different fixed reference voltage V12 to V7. By using different fixed reference voltages for the successive approximation conversions, it can be achieved that no missing codes occur during the successive approximation conversion. The scaling of the different fixed reference voltages V12 to V7 corresponds to a sub radix 2 approach for the binary scaled capacitances of the MSB (for the first number of bits).

Another way of using the sub radix 2 approach would be to scale the capacitance of the switch capacitor $210_1$ to $210_n$. However in the case of building the switch capacitor array 202 using unit capacitors, a scaling of the capacitances of the switch capacitors $210_1$ to $210_n$ in a sub radix 2 approach may not be feasible. Therefore, in the converting circuit 401 the reference voltages V12 to V7 for the binary scaled switch capacitor array 202 are sub radix 2 scaled. A possible scaling for the different fixed reference voltages V12 to V7 is (as a numerical example):
V12=3V, V11=3.05V, V10=3.1V, V9=3.15V, V8=3.2V, V7=3.25V.

A voltage range of the common variable reference voltage 105 may, for example, be from 0V to 3.3 V. The common variable reference voltage 105 may also be called Vcommon DAC. The above mentioned first voltage level of the common variable reference voltage 105 may therefore be 0V (e.g. ground potential) and the above mentioned second voltage level of the common variable reference voltage 105 may there fore be 3.3V (e.g. supply voltage). The common variable reference voltage provider 102 is configured to ramp the common variable reference voltage 105 from the first voltage level 0V to the second voltage level 3.3V.

With the scaling of the reference voltages for the most significant bits (MSB), it is achieved that no missing codes occur. This corresponds, as mentioned before, to a sub radix 2 approach. This may result in codes occurring double, which may be eliminated using a digital correction process.

As mentioned before, the 6 MSB capacitors (the switch capacitors $210_1$ to $210_n$) can be built from binary scaled unit capacitors. The sub radix 2 relation is achieved by a bitwise scaling of the different fixed reference voltages V12 to V7. The needed scaled reference voltages V12 to V7 may be centrally generated and distributed.

As can be seen from above, an amplitude of a first fixed reference voltage V12 of the plurality of fixed reference voltages V12 to V7 associated to a first switch capacitor $210_n$ comprising a comparatively large capacitance (in the concrete example 32 C), is smaller than an amplitude of a second fixed reference voltage V11 of the plurality of reference voltages V12 to V7 associated to a second switch capacitor $210_{n-1}$ comprising a comparatively smaller capacitance (in the concrete example 16 C). This may apply to all of the switch capacitors $210_1$ to $21_n$.

Figure 4B:
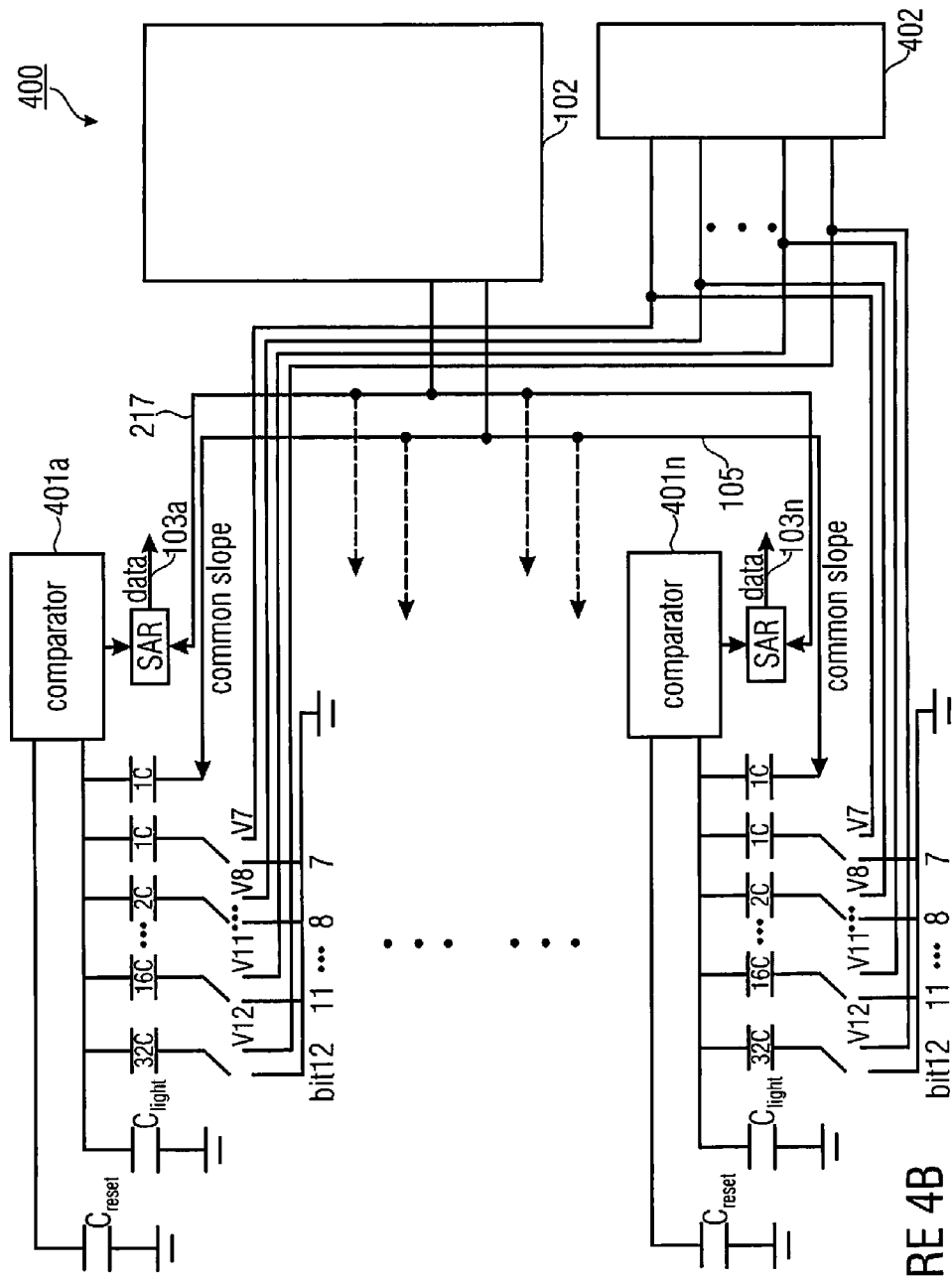

FIG. 4b shows a block diagram of a hybrid analog-to-digital converter 400. The hybrid analog-to-digital 400 differs from the hybrid analog-to-digital converter 200 from FIG. 2b in that it comprises a plurality of converting stages 401a to 401n, which differ from the converting stages 201a to 201n in that reference voltages for the first number of bits (of the MSB) are scaled. Furthermore, the hybrid analog-to-digital converter 400 comprises a fixed reference voltage provider 402, which is configured to provide a plurality of different fixed reference voltages V12 to V7 to each switch capacitor array 202 of each converting circuit 401a to 401n. Each fixed reference voltage of the plurality of reference voltages V12 to V7 is associated to one switch capacitor of a switch capacitor array 202 of a converting circuit 401a to 401n. The fixed reference voltage provider 402 is therefore configured to centrally generate and distribute the different fixed reference voltages V12 to V7 to the converting circuit 401a to 401n, As can be seen from FIG. 4b, every reference fixed voltage out of the plurality of different fixed reference voltages V12 to V7 is associated to the same switch capacitor within the switch capacitor arrays 202 of the converting circuits 401a to 401n. For example, the fixed reference voltage V12 is associated to switch capacitors of the switch capacitor arrays 202 having the highest capacitance (in the example 32 C) within the switch capacitor arrays 202, and a fixed reference voltage V7 is associated to capacitors having the smallest capacitance (in the concrete example 1 C) of the switch capacitors within the switch capacitor arrays 202.

The different fixed reference voltages V12 to V7 may be generated by a resistive divider or by a digitally controlled analog-to-digital converter comprised in the fixed reference voltage provider 402. A buffer may be needed to supply enough charge for the high number of column analog-to-digital converter (in an image sensor), or in general, for the high number of converting circuits 401a to 401n. Good linearity and no missing codes can be achieved.

To calculate the final analog-to-digital converter value (digital signals 103a to 103n) a small digital correction logic may be needed. This logic may necessitate the measured mismatch for the first MSB (the measured mismatch for the first bit of the successive approximation conversion). The number of MSB (the number of bits of the successive approximation conversion) which are in need of such a correction may depend on the production process. For an intended 180 nm semiconductor process, a correction of the first three MSB may be sufficient. This correction may be done off-chip or on-chip. An implementation on-chip may be very simple, for example, by a simple addition for the first three MSB. The mismatch of these capacitors (for the first three MSB) may be measured by the common slope digital-to-analog converter (by the common variable voltage provider 102). This mismatch can then be stored in a register and be used for the addition. With this enhancement strong monotonicity can be assured, which is desired for image sensors to prevent viewable image artifacts.

In the following, the working principle of the shown hybrid analog-to-digital converter 400 will be summarized using a precise example. The hybrid analog-to-digital converter 400 comprises a hybrid architecture. The hybrid architecture comprises the column binary scaled charge redistribution SAR analog-to-digital converters for the 6 MSB (for the first number of bits) and the common slope DAC for the remaining 6 LSB (for the second number of bits). The 6 binary scaled MSB capacitors (the switch capacitors $210_1$ to $210_n$) are in every column (of an image sensor). Before conversion, the signal after pixel reset is sampled on capacitors $C_{reset}$ (the target capacitors 208). After the charge transfer in the pixel is complete, the voltage is stored on capacitors $C_{light}$ (the intermediate capacitors 209). A charge redistribution successive approximation is done and the voltage on the input of the comparators 203 (at the second input terminals 206 of the comparators 203) serves as a starting point for the following slope conversion. The slope (the common variable reference voltage 105) is generated for all columns (for all converting circuits 401a to 401n) and is coupled to the individual column through a capacitor (through the coupling capacitor 215). For a 12-bit conversion, 6 MSB clock cycles and 64 remaining LSB ramp stamps are sufficient. This topology increases conversion speed and extends the resolution beyond feasibility of column slope ADC without huge switch capacitor arrays. Since the sampled voltage for the dark level of the pixel (the target voltage at the target capacitors 208) is used as the input for the comparators 203 (as a reference voltage), (inherent) correlated double sampling (CDS) operation is performed. A calibration to compensate mismatch can be done for the top two MSB (or the top 3 MSB) by measuring mismatch using the slope converter. This approach combines fast and power efficient SAR (successive approximation) conversion of the 6 MSB with low hardware for the remaining 6 LSB by slope conversion.

Figure 5:
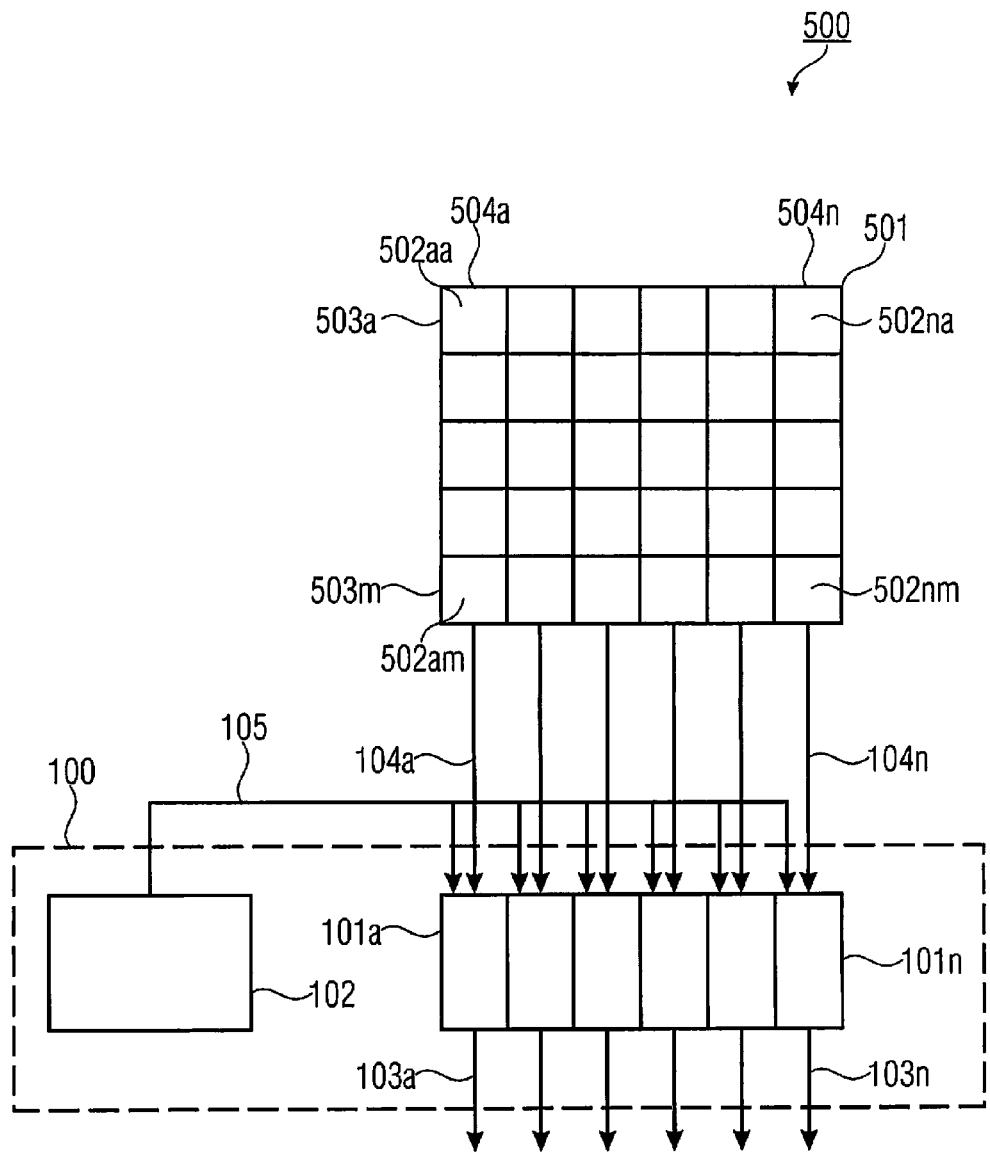
FIG. 5 shows a block diagram of an image sensor according to a further embodiment of the present invention.

FIG. 5 shows a block diagram of an image sensor 500 according to a further embodiment of the present invention. The image sensor 500 comprises a photo detector array 501. The photo detector array 501 comprises a plurality of photo detectors 502aa to 502nm. The photo detector array 501 is divided into a plurality of photo detector rows 503a to 503m, and a plurality of photo detector columns 504a to 504n. The indexes m, n, are arbitrary and depend on the resolution of the image sensor 500. Each photo detector out of the plurality of photo detectors 502aa to 502nm lies exactly within one photo detector column out of the plurality of photo detector columns 504a to 504n and within one photo detector row out of the plurality of photo detector rows 503a to 503m. As an example for a 12 Megapixel image sensor, the image sensor 500 may comprise 4000 photo detector columns and 3000 photo detector rows, and therefore, 12 million photo detectors.

A photo detector of the plurality of photo detectors 502aa to 502nm may, for example, be a photodiode The image sensor 500 further comprises a hybrid analog-to-digital converter comprising one converting circuit per photo detector column. In the concrete embodiment shown in FIG. 5, the image sensor 500 comprises the hybrid analog-to-digital converter 100 with the plurality of converting circuits 101a to 101n, wherein each converting circuit of the plurality of converting circuits 101a to 101n is associated to one photo detector column out of the plurality of photo detector columns 504a to 504n. The image sensor 500 may also comprise any other hybrid analog-to-digital converter according to embodiments of the present invention. Each of the converting circuits 101a to 101n is configured to successively perform an analog-to-digital conversion for each photo detector out of the plurality of photo detectors 502aa to 502nm lying in a photo detector column out of the plurality of photo detector columns 504a to 504n associated to the converting circuit. For example may a first converting circuit 101a of the plurality of converting circuits 101a to 101n be configured to provide digital signals 104a for photo detectors 502aa to 502am of the plurality of photo detectors 502aa to 502nm lying within a first photo detector column 504a of the plurality of photo detector columns 504a to 504n.

To obtain a complete picture using the image sensor 500, each converting circuit out of the plurality of converting circuits 101a to 101n performs m analog-to-digital conversions in parallel with the other converting circuits out of the plurality of converting circuits 101a to 101n. The common variable reference voltage provider 102, which provides the common variable reference voltage 105, on the basis of which, the converting circuit 101a to 101n perform their slope conversion, therefore provides the common variable reference voltage, m-times to each of the converting circuits 101a to 101n.

According to further embodiments, the photo detectors 502aa to 502nm may be so-called pinned photo diodes or 4-T photo diodes, each providing a reset voltage corresponding to a dark current of the photo detectors 502aa to 502nm, and a light voltage corresponding to a light current of the photo detectors 502aa to 502nm. A difference between a reset voltage and a light voltage of a photo detector out of the plurality of photo detectors 502aa to 502nm, determines an amount of light currently falling onto the photo detector. As mentioned before, the converting circuits 101a to 101n may therefore perform an inherent correlated double sampling, such that the digital signals 103a to 103n are a representation of the difference between the light and the reset value of the photo detector voltages of the photo detector 502aa to 502nm.

Figure 6:
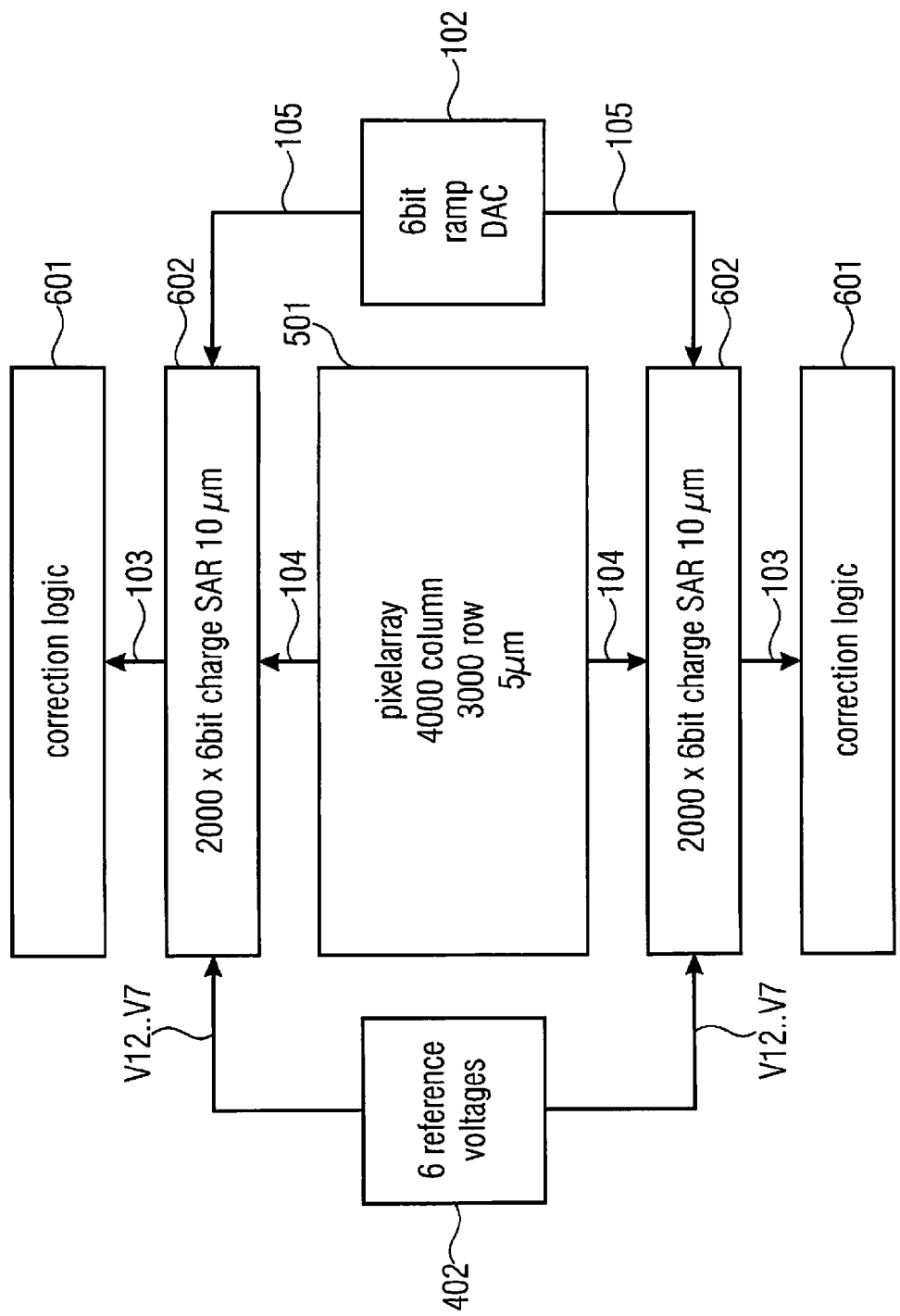
FIG. 6 shows a block diagram of an image sensor according to a further embodiment of the present invention.

FIG. 6 shows an image sensor 600 according to a further embodiment of the present invention. The image sensor 600 may be a more concrete example of the image sensor 500. The image sensor 600 comprises a photo detector array or pixel array 501, comprising 4000 photo detector columns and 3000 photo detector rows with a pixel size or a photo detector size of 5 μm. 2000 columns (analog input signal from photo detectors of 2000 photo detector columns) are digitized on top (using 2000 converting circuits), and another 2000 columns (analog input signal from photo detectors of another 2000 columns) are digitized on the bottom (using another 2000 converting circuits). The column spacing is thus 10 μm. As can be seen from FIG. 6, a 2000 6-bit charge redistribution converter 602 is placed on each side (on the top and bottom side), or in other words, 2000 converting circuits (for example, 2000 converting circuits 101, 201, or 401) are placed on each side of the image sensor 600. Six reference voltages V12 to V7 are generated (by the fixed reference voltage generator 402), buffered and fed to the charge redistribution analog-to-digital converters 602 (to the switch capacitor arrays of the converting circuits placed on each side of the image sensor 600). The first number of bits of each digital signal, or of the 6 MSB is converted by the successive approximation conversion using the 6 fixed reference voltages V12 to V7. The 6 LSB (or the second number of the digital signals) are converted by using a global 6-bit digital-to-analog converter (the common variable reference voltage provider 102 providing the common variable reference voltage 105 as a 6-bit global ramp to the converting circuit). The 12-bit result (comprising the digital signals 103) is routed to a correction logic 601 and driven off-chip. The correction logic 601 may be needed for compensating the double codes which may occur due to the scaling of the reference voltages V12 to V7 used by the converting circuits during the successive approximation conversion.

Figure 7:
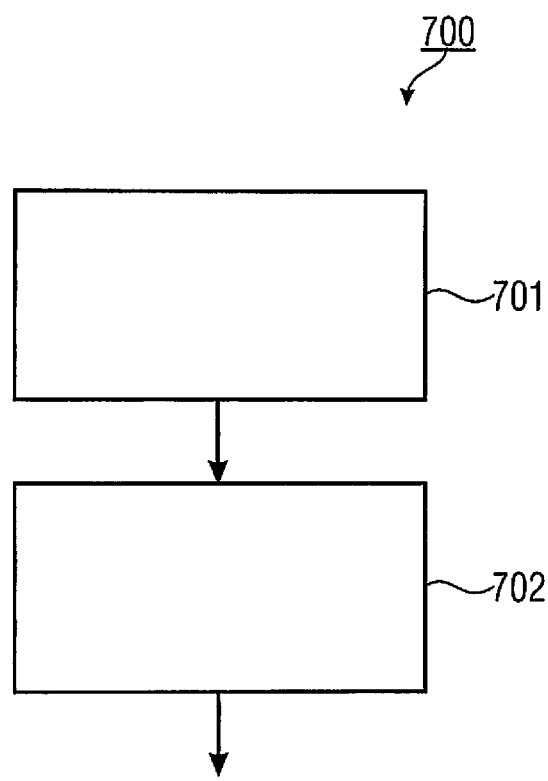
FIG. 7 shows a flow diagram of a method according to a further embodiment of the present invention.
Figure 8:
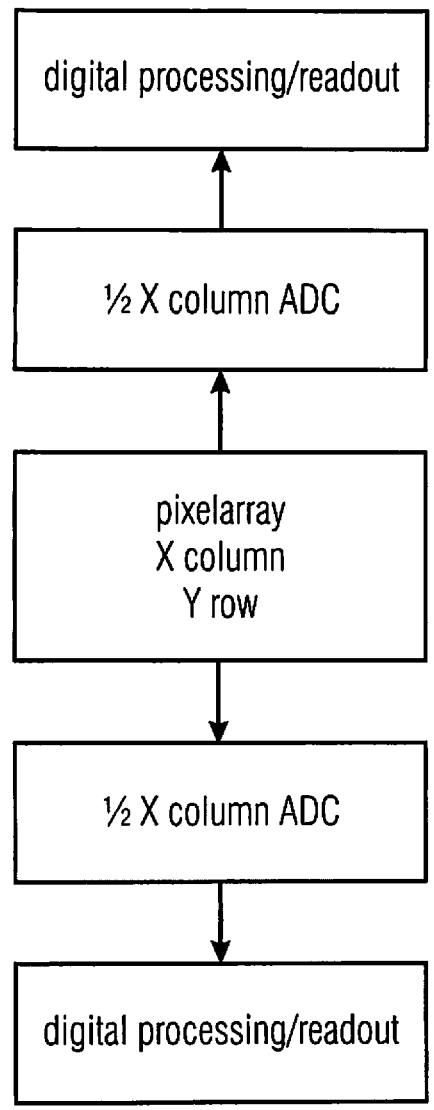
FIG. 8 shows a block diagram of a conventional column level analog-to-digital converter within an image sensor.

In this application bottom and top refer to the location of the converting circuits in regard to the photo detector array 501, when viewed from above, wherein the photo detector array 501 is arranged in the middle between top and bottom. The photo detector columns of the photo detector array 501 extend from the top to the bottom. The photo detector rows of the photo detector array 501 extend from the left to the right FIG. 7 shows a flow diagram of a method 700 for providing a plurality of digital signals based on a plurality of analog input signals.

The method 700 comprises a step 701 of simultaneously performing a plurality of successive approximation conversions to obtain, as a result of the successive approximation conversions, a plurality of first numbers of bits of the plurality of digital signals.

The method 700 further comprises a step 702 of simultaneously performing a plurality of slope conversions based on a common variable reference voltage to obtain a plurality of second numbers of bits, each of the second numbers of bits of the plurality of seconds number of bits corresponding to a difference between a corresponding analog input signal of the plurality of analog input signals and a result of a corresponding successive approximation conversion.

To summarize, CMOS image sensors necessitate very power and area effective analog-to-digital converters due to very high column count and small column spacing. Embodiments of the present invention make use of a combination of a fast charge redistribution SAR analog-to-digital converter and a slow but area efficient slope analog-to-digital converter. Compared to either implementing a SAR analog-to-digital converter, which necessitates higher area or a slope converter which is slow, the combination of both architectures enables a fast and area efficient implementation.

Embodiments of the present invention provide a hybrid SAR-slope converter for image sensors (for example, for CMOS image sensors). It combines fast and power efficient conversion of the MSB with a SAR converter in every column with the low hardware consumption of one central slope converter. The resulting hybrid analog-to-digital converter operates faster than a slope analog-to-digital converter and is smaller than a SAR analog-to-digital converter. Embodiments of the present invention may be fabricated using a 180 nm image sensor technology.

Embodiments of the present invention provide a combination of a charge redistribution converter, which works based on the method of the successive approximation with a slope method. For the more significant bit decisions, an SAR converter with the corresponding capacitances is used. For the low significant bit decisions, a slope converter is capacitively coupled. Due to the combination a speed improvement, especially for more channel systems compared to a pure slope method can be achieved with a reduction of the number of capacitances, compared to a SAR converter.

Embodiments of the present invention therefore provide a hybrid successive approximation charge redistribution slope converter (for image sensors).

An advantage of the embodiments of the present invention is that during the analog-to-digital conversion, higher resolutions can be achieved. This enables image sensors with a higher dynamic. Furthermore, the speed advantage may be used, enabling faster sensors. With these faster sensors, fast movements may be digitized in a better manner.

Embodiments of the present invention thus provide a hybrid SAR slope analog-to-digital converter, which enables higher resolution and higher conversion speed with low additional hardware than known in the art.

Embodiments of the present invention may be applicable in CMOS image sensors, but may also be applicable in other areas of multi-channel systems.

The method 700 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A hybrid analog-to-digital converter, comprising:
   a plurality of converting circuits, wherein each converting circuit of the plurality of converting circuits is configured to provide a digital signal based on an analog input signal by performing a successive approximation conversion to acquire, as a result of the successive approximation conversion, a first number of bits of the digital signal and by subsequently performing a slope conversion based on a common variable reference voltage to acquire a second number of bits of the digital signal, the second number of bits corresponding to a residual between the analog input signal and the result of the successive approximation conversion; and
   a common variable reference voltage provider configured to provide to each converting circuit of the plurality of converting circuits the common variable reference voltage.

2. The hybrid analog-to-digital converter according to claim 1,
   wherein the common variable reference voltage provider is configured to repeatedly ramp the common variable reference voltage from a first voltage level to a second voltage level independently from analog input signals of the plurality of converting circuits; and
   wherein the common variable reference voltage provider is configured to provide a common variable counter signal in dependence on an amplitude of the common variable reference voltage to each of the converting circuits of the plurality of converting circuits.

3. The hybrid analog-to-digital converter according to claim 2,
   wherein each converting circuit of the plurality of converting circuits is configured to save a counter value corresponding to an amplitude of the common variable reference voltage, at which a difference between its digital signal and its analog signal is minimal during the slope conversion and to derive the second number of bits based on the saved counter value.

4. The hybrid analog-to-digital converter according to claim 2,
   wherein the common variable voltage provider comprises a digital-to-analog converter configured to provide the common variable reference voltage as a plurality of stepwise increasing discrete voltage levels;
   wherein the common variable voltage provider is configured to provide the common variable counter signal as a plurality of stepwise increasing discrete counter values; and
   wherein each discrete counter value corresponds to exactly one discrete voltage level of the common variable reference voltage.

5. The hybrid analog-to-digital converter according to claim 4,
   wherein the digital-to-analog converter comprised in the common variable reference voltage provider is configured to adjust a step size or a number of discrete voltage levels of the common variable reference voltage, based on a precision adjust signal.

6. The hybrid analog-to-digital converter according to claim 1,
   wherein each converting circuit of the plurality of converting circuits comprises a comparator and a switch capacitor array; and
   wherein a first input terminal of the comparator is coupled to a target voltage node and a second input terminal of the comparator is coupled to an intermediate voltage node, to the switch capacitor array and to an output terminal of the common variable reference voltage provider, at which the common variable reference voltage is provided; and
   wherein each converting circuit of the plurality of converting circuits is configured to add a first amount of charge to the intermediate voltage node by performing the successive approximation conversion, using the switch capacitor array and the comparator, and to add a second amount of charge to the intermediate voltage node by performing the slope conversion, using the common variable reference voltage and the comparator, such that a difference between a target voltage at the target node and an intermediate voltage at the intermediate node is after the slope conversion equal to or smaller than the difference between the target voltage and the intermediate voltage after the successive approximation conversion.

7. The hybrid analog-to-digital converter according to claim 6,
   wherein each converting circuit of the plurality of converting circuits comprises a target capacitor coupled to the target node and an intermediate capacitor coupled to the intermediate node;
   wherein each converting circuit of the plurality of converting circuits is configured to charge the intermediate capacitor to the intermediate voltage and the target capacitor to the target voltage before each analog-to-digital conversion cycle; and
   wherein an amplitude of the intermediate voltage and an amplitude of the target voltage are dependent on a current analog-to-digital conversion cycle.

8. The hybrid analog-to-digital converter according to claim 7,
   wherein each converting circuit of the plurality of converting circuits is configured such that its analog input signal corresponds to the difference between the target voltage and the intermediate voltage before the successive approximation conversion, and such that its digital signal is a quantized digital representation of the difference between the target voltage and the intermediate voltage before the successive approximation conversion.

9. The hybrid analog-to-digital converter according to claim 6,
   wherein each switch capacitor array comprises a plurality of switch capacitors;
   wherein first terminals of the switch capacitors are coupled to the intermediate node; and
   wherein each converting circuit of the plurality of converting circuits is configured to switchably couple a second terminal of each switch capacitor of each switch capacitor array to a ground terminal or a fixed reference voltage terminal during the successive approximation conversion.

10. The hybrid analog-to-digital converter according to claim 9,
    further comprising a fixed reference voltage provider configured to provide to each switch capacitor array of each converting circuit of the plurality of converting circuits a plurality of different fixed reference voltages, wherein each fixed reference voltage of the plurality of reference voltages provided to a switch capacitor array is associated to one switch capacitor of the switch capacitor array.

11. The hybrid analog-to-digital converter according to claim 10,
wherein each switch capacitor array is configured such that an amplitude of a first fixed reference voltage of the plurality of reference voltages, associated to a first switch capacitor of the switch capacitor array is smaller than an amplitude of a second fixed reference voltage of the plurality of reference voltages, associated to a second switch capacitor of the switch capacitor array; and
wherein a capacitance of the first switch capacitor is, at least by a factor of 2 larger, than a capacitance of the second switch capacitor.

12. The hybrid analog-to-digital converter according to claim 9,
wherein each switch capacitor array is configured, such that capacitances of the switch capacitors are binary scaled;
wherein each converting circuit of the plurality of converting circuits comprises a coupling capacitor coupled between the intermediate node and the output terminal of the common variable reference voltage provider;
wherein a capacitance of the coupling capacitor is equal to a capacitance of a smallest capacitor within the plurality of the switch capacitors of the switch capacitor array; and
wherein the common variable reference voltage provider is configured such that the common variable reference voltage comprises ground potential during the successive approximation conversion.

13. The hybrid analog-to-digital converter according to claim 1,
wherein each converting circuit of the plurality of converting circuits comprises a comparator and a switch capacitor array; and
further comprising a fixed reference voltage provider configured to provide to each switch capacitor array of each converting circuit of the plurality of converting circuits a plurality of different fixed reference voltages, wherein each fixed reference voltage of the plurality of reference voltages provided to a switch capacitor array is associated to one switch capacitor of the switch capacitor array.

14. An image sensor comprising:
a photo detector array comprising a plurality of photo detector rows and a plurality of photo detector columns; and
a hybrid analog-to-digital converter, the hybrid analog-to-digital converter comprising:
a plurality of converting circuits, wherein each converting circuit of the plurality of converting circuits is configured to provide a digital signal based on an analog input signal by performing a successive approximation conversion to acquire, as a result of the successive approximation conversion, a first number of bits of the digital signal and by subsequently performing a slope conversion based on a common variable reference voltage to acquire a second number of bits of the digital signal, the second number of bits corresponding to a residual between the analog input signal and the result of the successive approximation conversion; and
a common variable reference voltage provider configured to provide to each converting circuit of the plurality of converting circuits the common variable reference voltage,
the hybrid analog-to-digital converter comprising one converting circuit per photo detector column;
wherein each converting circuit is configured to successively perform an analog-to-digital conversion for each photo detector lying in a photo detector column of the plurality of photo detector columns, associated to the conversion circuit.

15. The image sensor according to claim 14,
wherein each photo detector of the photo detector array is configured to provide a reset voltage and a light voltage; and
wherein a difference between the reset voltage of a photo detector and the light voltage of the photo detector determines an amount of light currently falling onto the photo detector.

16. A method for providing a plurality of digital signals, based on a plurality of analog input signals, the method comprising:
simultaneously performing a plurality of successive approximation conversions to acquire, as results of the successive approximation conversions, a plurality of first numbers of bits of the plurality of digital signals; and
simultaneously performing a plurality of slope conversions based on a common variable reference voltage to acquire a plurality of second numbers of bits of the plurality of digital signals, each of the second numbers of bits of the plurality of second numbers of bits corresponding to a difference between a corresponding analog input signal of the plurality of analog input signals and a corresponding result of a corresponding successive approximation conversion.

17. The method according to claim 16, further comprising:
providing a plurality of different fixed reference voltages to each switch capacitor array of each converting circuit of a plurality of converting circuits, wherein each fixed reference voltage of the plurality of reference voltages provided to a switch capacitor array is associated to one switch capacitor of the switch capacitor array.

\* \* \* \* \*